(12) United States Patent
Wortham

(10) Patent No.: US 10,139,452 B2
(45) Date of Patent: *Nov. 27, 2018

(54) STATE BASED FULL AND EMPTY CONTROL FOR RECHARGEABLE BATTERIES

(71) Applicant: Maxim Integrated Products, Inc., San Jose, CA (US)

(72) Inventor: Jason Allen Wortham, San Jose, CA (US)

(73) Assignee: Maxim Integraqted Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/785,043

(22) Filed: Oct. 16, 2017

(65) Prior Publication Data

US 2018/0038914 A1    Feb. 8, 2018

Related U.S. Application Data

(60) Continuation of application No. 14/715,392, filed on May 18, 2015, now Pat. No. 9,791,517, which is a
(Continued)

(51) Int. Cl.
*H02J 7/00* (2006.01)
*H02J 7/14* (2006.01)
(Continued)

(52) U.S. Cl.
CPC ....... *G01R 31/3651* (2013.01); *G01R 31/362* (2013.01); *H01M 10/44* (2013.01);
(Continued)

(58) Field of Classification Search
USPC ........ 320/132, 162, 136, 106, 110, 112, 113, 320/116, 125, 131, 145, 152; 324/427,
(Continued)

(56) References Cited

U.S. PATENT DOCUMENTS 4,390,841 A    6/1983    Martin et al.
5,795,664 A    8/1998    Kelly
(Continued)

FOREIGN PATENT DOCUMENTS

CN    1415973    5/2003
CN    1767310    5/2006
(Continued)

OTHER PUBLICATIONS

"Choosing a Rechargeable Battery", Electus Distribution, Reference Data Sheet: Recharge.pdf (1), 2001, 4 pgs total.
(Continued)

*Primary Examiner* — Alexis Pacheco
(74) *Attorney, Agent, or Firm* — Womble Bond Dickinson (US) LLP

(57)    ABSTRACT

State based full and empty control for rechargeable batteries that will assure a uniform battery empty condition, even in the presence of a load on the battery. A fuel gauge provides a prediction of the open circuit voltage of the battery, and when the predicted open circuit voltage of the battery reaches the predetermined open circuit voltage of an empty battery, the load is terminated, after which the battery will relax back to the predetermined open circuit voltage of an empty battery. A similar technique is disclosed for battery charging, allowing faster battery charging without overcharging. Preferably an RC battery model is used as the fuel gauge to provide the prediction, but as an alternative, a coulomb counter may be used to provide the prediction, with error correction between successive charge discharge cycles.

17 Claims, 3 Drawing Sheets

Related U.S. Application Data division of application No. 13/311,297, filed on Dec. 5, 2011, now Pat. No. 9,035,616.

(60) Provisional application No. 61/420,627, filed on Dec. 7, 2010.

(51) Int. Cl.
  *G01R 31/36* (2006.01)
  *H01M 10/44* (2006.01)
  *H01M 10/48* (2006.01)

(52) U.S. Cl.
  CPC ............ *H01M 10/48* (2013.01); *H02J 7/0078* (2013.01); *H02J 7/00* (2013.01); *H02J 7/0011* (2013.01); *H02J 2007/005* (2013.01)

(58) Field of Classification Search
  USPC .................................................. 324/426, 433
  See application file for complete search history.

(56) References Cited

U.S. PATENT DOCUMENTS

| | | | |
|---|---|---|---|
| 5,808,445 A | 9/1998 | Aylor et al. | |
| 6,057,050 A | 5/2000 | Parise | |
| 6,138,466 A | 10/2000 | Lake et al. | |
| 6,166,524 A | 12/2000 | Takeuchi et al. | |
| 6,307,379 B2 | 10/2001 | Podrazhansky et al. | |
| 6,329,822 B1 | 12/2001 | Powers | |
| 6,366,054 B1 | 4/2002 | Hoenig et al. | |
| 6,549,014 B1 | 4/2003 | Kutkut et al. | |
| 6,789,026 B2 | 9/2004 | Barsoukov et al. | |
| 6,892,148 B2 * | 5/2005 | Barsoukov ............ | G01R 31/361 320/132 |
| 6,914,414 B2 | 7/2005 | Hamada et al. | |
| 7,076,375 B2 | 7/2006 | Raichle et al. | |
| 7,095,211 B2 | 8/2006 | Denning | |
| 7,102,310 B2 | 9/2006 | Ishishita | |
| 7,197,487 B2 | 3/2007 | Hansen et al. | |
| 8,264,202 B2 | 9/2012 | Sahu et al. | |
| 8,635,037 B2 | 1/2014 | Quet | |
| 2002/0130637 A1 | 9/2002 | Schoch | |
| 2004/0257087 A1 | 12/2004 | Murakami | |
| 2005/0057255 A1 * | 3/2005 | Tate, Jr. ............ | G01R 31/3624 324/426 |
| 2007/0029973 A1 | 2/2007 | Ashizawa et al. | |
| 2008/0203969 A1 | 8/2008 | Kurihara et al. | |
| 2009/0261786 A1 * | 10/2009 | Hsu ...................... | H02J 7/0072 320/162 |
| 2009/0273320 A1 * | 11/2009 | Ungar .................. | H01M 4/5815 320/162 |
| 2010/0036627 A1 | 2/2010 | Bergveld et al. | |
| 2010/0045240 A1 * | 2/2010 | Bergveld ............ | G01R 31/362 320/132 |
| 2010/0090651 A1 * | 4/2010 | Sahu .................. | G01R 31/3624 320/132 |
| 2011/0234167 A1 | 9/2011 | Kao et al. | |
| 2012/0038322 A1 * | 2/2012 | Moorhead ............ | B60L 11/1861 320/136 |
| 2012/0049802 A1 * | 3/2012 | Barsukov ........... | G01R 31/3651 320/136 |

FOREIGN PATENT DOCUMENTS

| | | |
|---|---|---|
| CN | 101535827 | 9/2009 |
| EP | 0471698 | 9/1993 |
| JP | 08-228440 | 9/1996 |
| JP | 2001-208815 | 8/2001 |
| WO | WO-01/25020 | 4/2001 |
| WO | WO-2009/126734 | 10/2009 |

OTHER PUBLICATIONS

"Low-Cost I2C Battery Monitor", Dallas Semiconductor, DS2745 Data Sheet, Sep. 14, 2005, pp. 1-14.

"MAX17040/MAX17041 Compact, Low-Cost 1S/2S Fuel Gauges", Maxim Integrated Products, Inc., Sunnyvale, California, Aug. 2011, pp. 1-13.

"MAX17043/MAX17044 Compact, Low-Cost 1S/2S Fuel Gauges with Low-Battery Alert", Maxim Integrated Products, Inc., Sunnyvale, California, Aug. 2011, pp. 1-14.

"MAX17047 ModelGauge m3 Fuel Gauge", Maxim Integrated Products, Inc., Sunnyvale, California, Sep. 2011, pp. 1-46.

"MAX17048/MAX17049 Micropower 1-Cell/2-Cell Li+ ModelGauge ICs", Maxim Integrated Products, Inc., Sunnyvale, California, Feb. 2012, pp. 1-19.

"MAX17058/MAX17059 1-Cell/2-Cell Li+ModelGauge ICs", Maxim Integrated Products, Inc., Sunnyvale, California, Feb. 2012, pp. 1-16.

"Notice of Allowance dated Dec. 26, 2016; Chinese Patent Application No. 201110437156.2", dated Dec. 26, 2016.

"Office Action dated Jan. 15, 2016; Chinese Patent Application No. 201110437156.2", dated Jan. 15, 2016.

"Office Action dated Jun. 24, 2016; Chinese Patent Application No. 201110437156.2", dated Jun. 24, 2016.

"Office Action dated May 22, 2015; Chinese Patent Application No. 201110437156.2", dated May 22, 2015.

"Performance Characteristics", MPower Solutions, 2005, 10 pgs total.

"SBS 1.1-Compliant Gas Gauge Enabled with Impedance Track (TM) Technology for Use with the bq29312A", Texas Instruments, bq20z80-V101 Data Sheet, Sep. 2004, 73 pgs total.

"Stand-Alone Fuel Gauge IC", Dallas Semiconductor, DS2782 Data Sheet, Apr. 25, 2005, pp. 1-25.

"Stand-Alone Fuel Gauge IC", Dallas Semiconductor, DS2780 Data Sheet, Dec. 9, 2004, pp. 1-27.

Rong, Peng et al., "An Analytical Model for Predicting the Remaining Battery Capacity of Lithium-Ion Batteries", IEEE Transactions on Very Large Scale Integration VLSI Systems, vol. 14, No. 5, May 2006, pp. 1-12.

Simpson, Chester, "Characteristics of Rechargeable Batteries", National Semiconductor, 2005, 10 pgs total.

* cited by examiner

STATE BASED FULL AND EMPTY CONTROL FOR RECHARGEABLE BATTERIES

CROSS-REFERENCE TO RELATED APPLICATIONS

This application is a continuation of Ser. No. 14/715,392 filed May 18, 2015, which is a divisional of U.S. patent application Ser. No. 13/311,297 filed Dec. 5, 2011, which claims the benefit of U.S. Provisional Patent Application No. 61/420,627 filed Dec. 7, 2010.

BACKGROUND OF THE INVENTION

1. Field of the Invention

The present invention relates to charging methods for rechargeable batteries.

2. Prior Art

The standard definition of empty for a (rechargeable) battery is when a particular battery terminal voltage defined as the empty voltage occurs. This definition is naïve and simple-minded, since the external voltage says little about the internal state of the battery. The real reason for this definition is that there has been no better way to define empty, and battery vendors must provide a rule of some sort, so they define a voltage.

Other approaches have been used, but they lose capacity as a function of load, temperature, battery characteristic, and empty voltage. For instance, coulomb counters have been used, but a coulomb counter must traverse full and empty often or error accumulates. Also there is no reliable method to recognize actual light-load capacity shrinkage, since the capacity to an empty voltage is dependent on the actual load from each cycle, because of battery impedance. Another approach uses battery impedance to predict traditional cell voltage definition of empty. Still another approach is to use a previous model gauge approach, that is, to use empty compensation to predict traditional cell voltage definition of empty, i.e., to account for the relaxation of a battery after a load is removed so that after relaxation, the open circuit voltage of the battery should be the predetermined empty voltage. All of these previous approaches result in variation of capacity utilization and residual charge which is unused.

Maxim Integrated Products, assignee of the present invention, manufactures and sells voltage-based battery fuel gauges that model the battery itself, and track the state of charge of the battery independent of the current load, if any, on the battery. In particular, an ideal battery of a given amp-hour capacity would provide a constant voltage output until outputting its total amp-hour capacity, after which the battery voltage would fall to zero. Real batteries, however, exhibit a decrease in terminal voltage with a decreasing state of charge and/or an increasing current load. Some batteries have a terminal voltage that falls off rapidly as the fully discharged state is approached.

One battery model that can be used is a simple RC network, where R represents the internal impedance of the battery and C represents the equivalent capacitance of the battery for any given open circuit battery voltage. R can be easily determined by loading and unloading the battery, and to the first order, generally can be taken as a constant value. The apparent capacitance C in the simple RC model at any point in the open circuit voltage versus state of charge curve is equal to the inverse of the rate of change of the open circuit voltage of the battery per amp-hour of current withdrawn. Consequently one may plot the equivalent capacitance of the battery versus open circuit voltage, and the plot of capacitance versus battery open circuit voltage can be approximated as piecewise constant C values over various increments of the open circuit voltage. Of course R and C may be scaled as desired without effecting the result. Then on charging and discharging, using the RC model and sensing the battery terminal voltage and current to and from the battery, the open circuit voltage of the battery can be calculated to determine the state of charge of the battery independent of the current flow. Of course one can also use a more complicated battery model to account for such things as long term recovery of the battery (a long time constant component), temperature, variations in battery impedance (R), current, etc. Also a coulomb counter can be used with such modeling, the coulomb counter increasing the transient and short term accuracy of the modeling and the modeling increasing the long term accuracy of the coulomb counter.

In the description to follow, whenever exemplary values are given, it is assumed that the battery is a Li-ion battery, though the principles of the present invention are applicable to other types of rechargeable batteries as well.

One embodiment of the present invention takes advantage of the fact that by modeling the battery, such as in the prior art described above, one can know the open circuit voltage of the battery, even when the battery is under a load. The particular model used is not of great importance, as any reasonable prediction of the open circuit voltage of a battery under load will be better at determining the battery state of charge than simply using the terminal voltage of the battery for that purpose. Thus the present invention allows the setting of state based full and empty conditions of the battery, and adhering to those states even when under a load.

By way of example, state-based empty control allows the immediate battery terminal voltage to be disregarded and allow full battery utilization across a wide range of load conditions, such as load variations, temperature variations, battery variations, age, etc. Normally the impedance drop of a battery would be responsible for capacity loss. Additionally, state based full and empty control reduces the overall error budget which allows for better battery utilization. In particular, state based full and empty control takes advantage of the capacity of the specific battery being monitored, rather than limiting that capacity because of battery impedance. State based full and empty control can also be used to provide additional well controlled limitations on battery charge and discharge limits for the purpose of battery lifespan extension. This is especially important in applications which demand more than the typical 5 year battery lifespan (such as automotive, which demands more than 10 years).

Figure 1A:
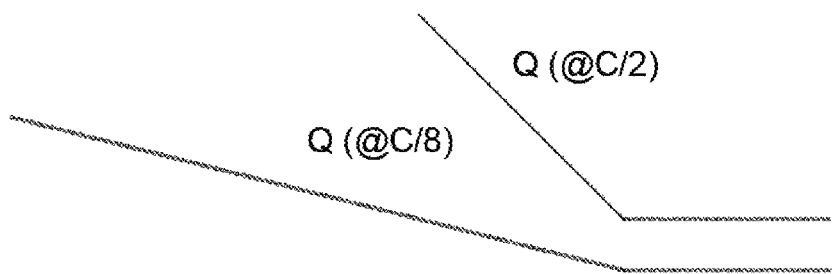
FIGS. 1a through 1d depict the state based empty vs. the traditional methods of defining empty.
Figure 1B:
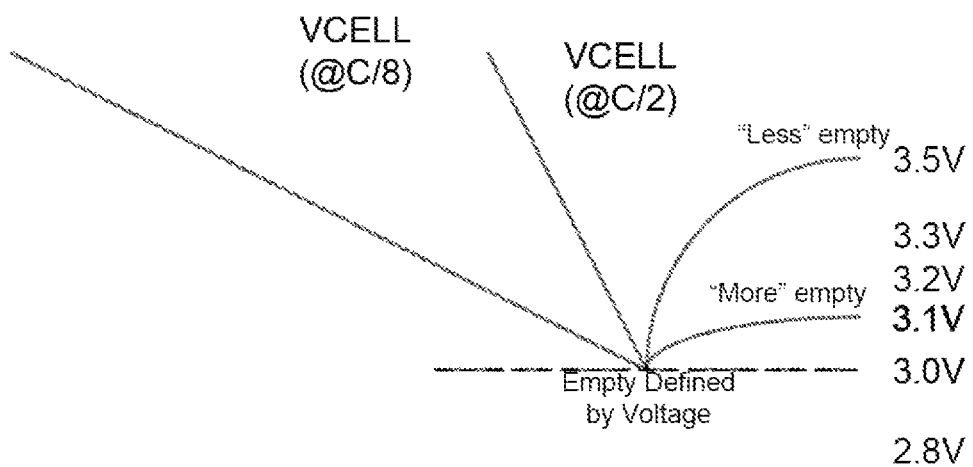
Figure 1C:
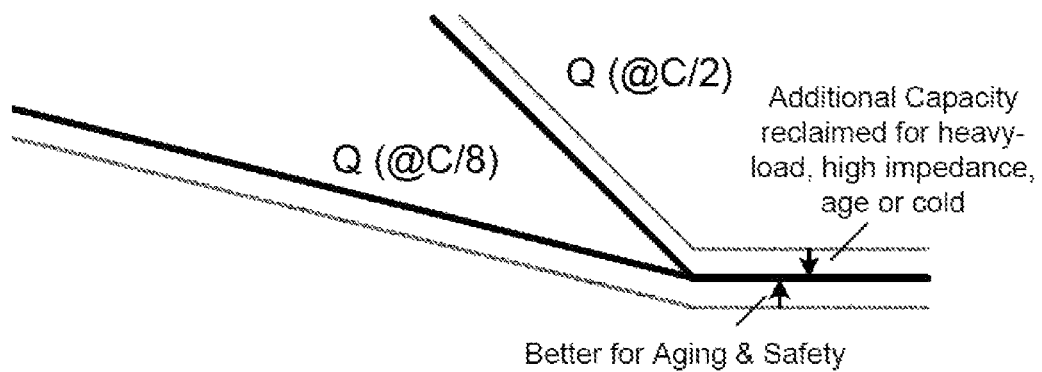
Figure 1D:
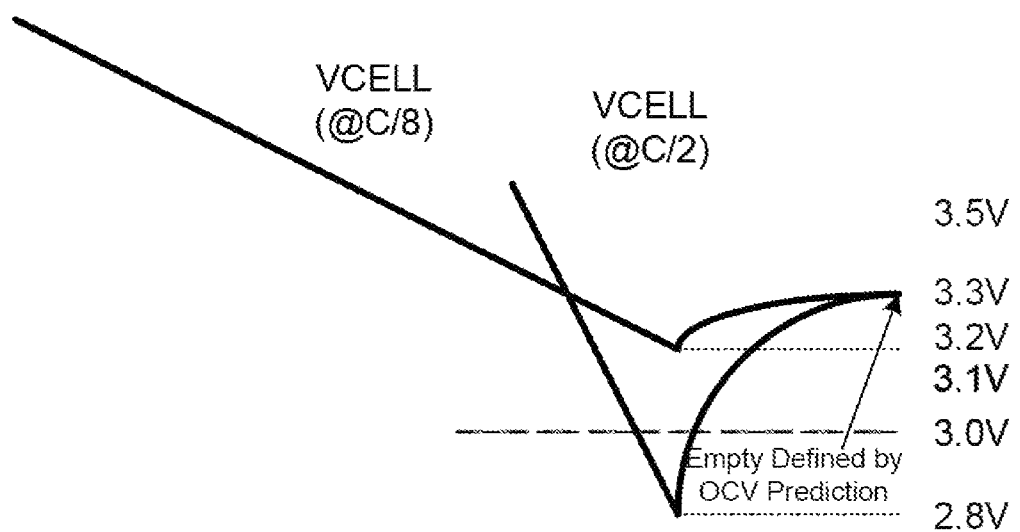

FIGS. 1a through 1d depict the state based empty vs. the traditional methods of defining empty. In these curves, the thin lines or curves represent traditional methods and the thick lines or curves represent the state based empty of the present invention. The curves for Q(@C/2) represent the discharge rate under a heavy load, while the curves for Q(@C/8) represent the discharge rate for a light load. The traditional method stops at the same immediate battery voltage independent of load (3.0 volts in FIG. 1b), yet stops or settles at a different battery state which is evidenced by the difference in the following relaxation voltage. The state of the battery (open circuit battery terminal voltage) is different in each of these two cases, as can be seen in FIGS. 1a and 1c. However, the state based empty of the present invention stops at the same state (same open circuit battery terminal voltage as shown in FIG. 1c), but allows for a different immediate battery voltage when stopping (FIG. 1d), and manages the following relaxation state to be relatively independent of load condition, to settle on the same open circuit voltage. To achieve this, the fuelgauge must be capable of accurate OCV predictions, which is a compounded challenge near empty when OCV and resistance become very nonlinear.

The state based full condition also provides better control of the full state for optimized charge control and charge speed. This can be achieved in life-span optimized applications, such as 3-year warrantee situations (currently seen in the industry for Apple and HP laptop computers). In these applications the charge voltage is often reduced from 4.2V to 4.1V to improve battery lifespan, since time at full often dominates as a cause of battery aging (especially for users who keep laptops always plugged in). The common solution for this lifespan extension is to simply charge to 4.1V instead of 4.2V. A smarter way to achieve the same lifespan improvement is to charge to a higher immediate battery terminal voltage, such as 4.2V, but change charge termination to occur at the same state (same open circuit battery terminal voltage) as the prior art 4.1V charging. This provides lifespan extension (and warrantee extension) while simultaneously providing a feature to accelerate charging.

Figure 2:
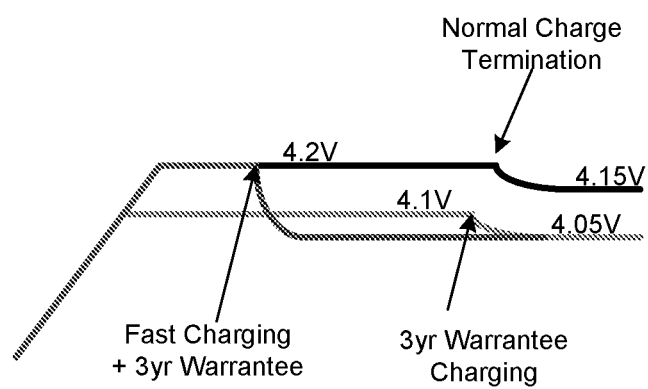
FIG. 2 illustrates the fast safe charging of a rechargeable battery using the state based full as defined by the present invention.

This concept is depicted in the FIG. 2. The sloped line at the left represents the charging rate. For an extended battery life in the prior art, the charging voltage peaks at 4.1 volts, and after a period of time, the charger is shut off and the battery open circuit voltage relaxes to 4.05 volts. With the present invention, charging can proceed to 4.2 volts for a shorter time to achieve the same state of charge, with the relaxation starting earlier and being more pronounced to ultimately reach the same open circuit voltage of 4.05 volts, thereby charging to the same open circuit voltage as the prior art charging technique produces (4.05 volts). Again this is achieved with a fuelgauge that manages an accurate OCV prediction. This same concept might be used for the 4.2V charging by overcharging to 4.3V but stopping early to the same state as 4.2V full. However, one should verify that going to an even higher charging voltage than specified by the battery manufacturer, even for a short time, would possibly somehow not achieve the desired effect or further shorten the battery life.

In extreme long lifespan applications, it is common to charge to only 70% and discharge to only 30% in order to maximize the total battery life utility (cycles*capacity). This is done in space applications where the service cost is extreme, but it is also done in automotive applications where the vehicle must last more than 10 years. State based full and empty control can extend this existing concept by more accurately and directly managing battery state by the open circuit prediction and perception used in the present invention.

Thus by having a good prediction of the battery state, one can more accurately define the full and empty states and utilize more of the battery capacity without risk of overcharging or overdischarging the battery. As a result, state based full and empty control should improve run-time by more than 30% for an aged battery because of its higher impedance. At cold temperatures (such as 0° C.) a battery can lose over half the capacity. At cold, state based full and empty control can improve run-time by more than 50%. When the loading on the battery is high, there is much more voltage drop, and battery voltage is more disassociated with battery state. At 1 C load, state based full and empty control can improve run-time by more than 20% on some new batteries, relative to higher 3.4V and 3.3V empty voltages.

Fuel-gauging is a real-time activity and cannot be allowed to depend on a future relaxed condition which happens after the critical event (empty) is already past. Real-time fuel-gauging must make its predictions while there is loading present. By defining empty according to a prediction of the open circuit voltage, the fuel-gauge can actually limit and manage the empty state of the battery, instead of using a simple immediate voltage. This will be typically performed with 2% or 3% battery capacity held in reserve, i.e., discharge will be terminated at 2% or 3% actual battery state of charge to leave a reserve capacity. That reserve capacity may be used to support:

1. Reserve & background functions (saving data, shutting down, maintaining clock).
2. Error budget (no fuel-gauge can be perfect).
3. Protect the battery from overdischarge. Discharging down to the bottom 1% of the battery could injure the battery and will accelerate aging.

Another technique that could be used to practice the present invention is to use a coulomb counter type of fuel gauge and note the open circuit voltage of the battery after each discharge and after the battery has an opportunity to relax. Then the coulomb count from full to empty may be adjusted up or down for the next charge discharge cycle based on the error between the open circuit voltage of the battery after relaxation and the intended open circuit voltage of the battery representing empty. Similarly, the open circuit voltage of the battery after each charge and after the battery has an opportunity to relax could be noted. Then the coulomb count from empty to full may be adjusted up or down for the next discharge charge cycle based on the error between the open circuit voltage of the battery after relaxation and the intended open circuit voltage of the battery representing full.

While this could work, it has the disadvantage that it is dependent on the habits of the device user even more than the typical coulomb counter. In particular, not only may the user of the device not fully charge the battery between discharges, which allows drift in the coulomb count, but the user may initiate recharging right after an indicated empty occurs, so that an accurate reading of open circuit voltage after an empty is indicated is not obtainable. Accordingly the battery model method is preferred, though the specific battery model used is itself a matter of preference and the model itself is not a part of this invention.

Thus the present invention has a number of aspects, which aspects may be practiced alone or in various combinations or sub-combinations, as desired. While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of determining an empty state of a rechargeable battery comprising:

predicting an open circuit voltage of the battery, even in the presence of a variable load on the battery;

predetermining an open circuit voltage at which the battery is to be considered fully discharged that is independent of the variable load on the battery;

in the presence of varying loads on the battery, allowing the battery to discharge to a terminal voltage below the open circuit voltage at which the battery will be considered discharged until the open circuit voltage prediction reaches the open circuit voltage at which the battery is to be considered fully discharged;

terminating the discharging when the predicted open circuit voltage of the battery reaches the open circuit voltage at which the battery is to be considered fully discharged.

2. The method of claim 1 wherein the open circuit voltage of the battery is predicted using a fuel gauge.

3. The method of claim 2 wherein the fuel gauge is a simulated battery model.

4. The method of claim 3 wherein the battery model is a resistor capacitor battery model.

5. The method of claim 2 wherein the fuel gauge comprises a voltage model fuel gauge and a coulomb counter.

6. The method of claim 2 wherein the fuel gauge comprises a resistor capacitor battery model and a coulomb counter.

7. The method of claim 1 further comprising determining a full state of the battery, wherein the battery is a rechargeable battery, by;

predetermining an open circuit voltage at which the battery is to be considered fully charged;

charging the battery to a terminal voltage in excess of the open circuit voltage at which the battery is to be considered fully charged;

terminating the charging when the predicted open circuit voltage of the battery reaches the open circuit voltage at which the battery is to be considered fully charged independent on the load on the battery.

8. The method of claim 7 wherein the fuel gauge is a coulomb counter.

9. The method of claim 8 wherein the coulomb count of the coulomb counter from full to empty is adjusted up or down based on an error between the open circuit voltage of the empty battery after relaxation and the intended open circuit voltage of the battery representing empty, and the coulomb count from empty to full is adjusted up or down for the next charge cycle based on an error between the open circuit voltage of the battery after relaxation and the intended open circuit voltage of the battery representing full.

10. The method of claim 1 wherein the battery is modeled by:

a fuel gauge that predicts the open circuit voltage of a battery responsive to at least one of a terminal voltage of the battery and current out of the battery, even when the battery is under a load;

monitoring at least one terminal voltage of the battery or the current out of the battery.

11. The method of claim 10 wherein the fuel gauge is a voltage model fuel gauge, and the at least one of the terminal voltage of the battery and current out of the battery is the terminal voltage of the battery.

12. The method of claim 11 wherein the fuel gauge includes a coulomb counter, and the at least one of the terminal voltage of the battery and current out of the battery is both the terminal voltage of the battery and the current in and out of the battery.

13. The method of claim 10 wherein the fuel gauge is a coulomb counter, the at least one of the terminal voltage of the battery or current out of the battery is the current out of the battery, and the coulomb count from full to empty is adjusted up or down for the next charge discharge cycle based on an error between the open circuit voltage of the battery after relaxation and the intended open circuit voltage of the battery representing empty.

14. A method of charging a rechargeable battery to a full state of the battery comprising:

providing a fuel gauge that predicts the open circuit voltage of the battery responsive to a terminal voltage of the battery and current to and from of the battery, even when the battery is under a load or being charged, the fuel gauge having a voltage model fuel gauge and a coulomb counter;

monitoring the terminal voltage of the battery and the current in and out of the battery;

charging the battery to a terminal voltage exceeding a predetermined full state battery voltage; and terminating the charging of the battery when the predicted open circuit voltage is equal to a predetermined full state battery voltage.

15. The method of claim 14 wherein the coulomb count from empty to full is adjusted up or down for the next discharge charge cycle based on an error between the open circuit voltage of the battery after relaxation and the intended open circuit voltage of the battery representing full.

16. The method of claim 14 wherein the coulomb count from full to empty is adjusted up or down for the next charge discharge cycle based on an error between the open circuit voltage of the battery after relaxation and the intended open circuit voltage of the battery representing empty.

17. The method of claim 14 further comprising terminating a load on a battery when an empty state of the battery is reached comprising:

determining when the predicted open circuit voltage is equal to a predetermined empty state battery voltage; and terminating the load when the predicted open circuit voltage of the battery reaches the predetermined open circuit voltage of an empty battery.

* * * * *